(12) United States Patent
Tolchinsky et al.

(10) Patent No.: US 7,473,614 B2
(45) Date of Patent: Jan. 6, 2009

(54) METHOD FOR MANUFACTURING A SILICON-ON-INSULATOR (SOI) WAFER WITH AN ETCH STOP LAYER

(75) Inventors: Peter G. Tolchinsky, Beaverton, OR (US); Martin D. Giles, Portland, OR (US); Michael L. McSwiney, Scappoose, OR (US); Mohamad Shaheen, Portland, OR (US); Irwin Yablok, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 306 days.

(21) Appl. No.: 10/987,775

(22) Filed: Nov. 12, 2004

(65) Prior Publication Data

US 2006/0102988 A1    May 18, 2006

(51) Int. Cl.
    *H01L 21/76* (2006.01)
(52) U.S. Cl. .................. 438/407; 438/473; 438/476; 257/E21.32
(58) Field of Classification Search ........... 438/149, 438/311, 407, 473, 476; 257/E21.32
See application file for complete search history.

(56) References Cited

U.S. PATENT DOCUMENTS 5,468,657 A    11/1995   Hsu
5,728,624 A *  3/1998    Linn et al. ............... 438/459
5,869,359 A *  2/1999    Prabhakar ................ 438/149
6,380,055 B2 * 4/2002    Gardner et al. ........... 438/585
2002/0022308 A1 2/2002   Dong-Ho, et al.

OTHER PUBLICATIONS

Soderbarg [Fabrication of BESOI—materials using implanted nitrogen as an effective etchstop barrier], 1989 IEEE SOS/SOI Technology Conference (Oct. 3-5, 1989) pp. 64].*

P.L.F. Hemment et al., "High quality silicon on insulator structures formed by the thermal redistribution of implanted nitrogen", 1985 American Institute of Physics, Appl. Phys. Lett., vol. 46 No. 10, May 15, 1985, pp. 952-954.

W. Ensinger et al., "Formation of silicon nitride layers by nitrogen ion irradiation of silicon biased to a high voltage in an electron cyclotron resonance microwave plasma", 1998 American Institute of Physics, Appl. Phys. Lett., vol. 72 No. 10, Mar. 9, 1998, pp. 1164-1166.

C.D. Meekison et al., "A transmission electron microscope investigation of the dose dependence of the microstructure of silicon-on-insulator structures formed by nitrogen implantation of silicon", 1991 American Institute of Physics, J. Appl. Phys., vol. 69 No. 6, Mar. 15, 1991, pp. 3503-3511.

S. Nakashima et al., "Thickness increment of buried oxide in a SIMOX wafer by high-temperature oxidation", Proceedings 1994 IEEE International SOI Conference, Oct. 1994, pp. 71-72.

(Continued)

*Primary Examiner*—Thanhha Pham
(74) *Attorney, Agent, or Firm*—Kenneth A. Nelson

(57) ABSTRACT

Embodiments of a silicon-on-insulator (SOI) wafer having an etch stop layer overlying the buried oxide layer, as well as embodiments of a method of making the same, are disclosed. The etch stop layer may comprise silicon nitride, nitrogen-doped silicon dioxide, or silicon oxynitride, as well as some combination of these materials. Other embodiments are described and claimed.

7 Claims, 8 Drawing Sheets

OTHER PUBLICATIONS

A. Matsumura et al., "Technological innovation in low-dose SIMOX wafers fabricated by an internal thermal oxidation (ITOX) process", 2002 Elsevier Science B.V., Microelectronic Engineering 66 (2003), pp. 400-414.

Acero M C, et al. "Anisotropic etch-stop properties of nitrogen-implanted silicon" Sensors and Actuators A, Elsevier Sequoia S.A. Lausanne, CH, vol. A45, No. 3, Dec. 1, 1994, pp. 219-225, XP000482632, ISSN: 0924-4247.

International Search Report of the International Searching Authority; Dated Apr. 1, 2006; PCT/US05/041544, 4 pgs.

International Written Opinion of the International Searching Authority; Dated May 12, 2007; PCT/US05/041544, 12 pgs.

Yi W B, et al. "Formation of total-dose-radiation hardened materials by sequential oxygen and nitrogen implantation and multi-step annealing" Semiconductor science and technology, IOP, Bristol, GB, vol. 19, No. 5, May 2004 pp. 571-573 XP001212582, ISSN: 0268-1242.

Yuehui Yu, et al. "Auger electron and IR spectroscopic studies of SOI structure formed by oxygen and nitrogen implantation" Journal of Physics D. Applied Physics, IOP Publishing, Bristol, GB, vol. 23, No. 4, Apr. 14, 1990, pp. 449-454, XP020015340, ISSN: 0022-3727.

* cited by examiner

METHOD FOR MANUFACTURING A SILICON-ON-INSULATOR (SOI) WAFER WITH AN ETCH STOP LAYER

FIELD OF THE INVENTION

The invention relates generally to the manufacture of integrated circuit devices and, more particularly, to the manufacture of a silicon-on-insulator (SOI) wafer having an etch stop layer overlying the buried oxide layer.

BACKGROUND OF THE INVENTION

A silicon-on-insulator (SOI) wafer may include a base layer of silicon, an insulating layer comprised of silicon dioxide overlying the base layer, and an upper silicon layer overlying the silicon dioxide layer. The silicon dioxide insulating layer is often referred to as the "buried oxide" layer. Integrated circuits including a collection of transistors and other circuit elements can be fabricated in the upper silicon layer. SOI wafers offer the potential for fabricating large-scale integrated circuits (ICs) that, for example, provide high-speed operation and exhibit low power consumption.

Methods for manufacturing SOI wafers include wafer bonding and separation by implanted oxygen (SIMOX). To form an SOI wafer by wafer bonding, a silicon dioxide layer is formed on one surface of a first silicon wafer, and a second silicon wafer is then bonded to this surface (e.g., the surface over which the oxide layer has been formed). The second wafer, which may be thinned, forms an upper silicon layer that overlies a buried oxide layer. To form an SOI wafer by SIMOX, oxygen ions are implanted into a silicon wafer, and the wafer is annealed to form a buried layer of silicon dioxide within the silicon wafer. An example of a SIMOX process can be found in Matsumura et al., *Technological Innovation in Low-Dose SIMOX Wafers Fabricated by an Internal Thermal Oxidation (ITOX) Process*, MICROELECTRONIC ENGINEERING, vol. 66, pgs. 400-414 (2003).

One problem with SOI wafers is that the buried oxide layer may provide poor etch resistance (during, for example, the formation of isolation trenches). It has been suggested that silicon nitride be used as the insulating layer in an SOI wafer rather than silicon dioxide, as silicon nitride may in some instances provide better etch resistance than silicon dioxide. An example of a technique for creating an SOI wafer having a silicon nitride insulating layer is described in Meekison et al., *A Transmission Electron Microscope Investigation of the Dose Dependence of the Microstructure of Silicon-on-Insulator Structures Formed by Nitrogen Implantation of Silicon*, JOURNAL OF APPLIED PHYSICS, vol. 69, no. 6 (1991). Silicon nitride is, however, a poor insulator in comparison to silicon dioxide. The band gap of silicon nitride is approximately 40 percent less than that of silicon dioxide, so the electrical isolation afforded by silicon nitride is significantly less than that provided by silicon dioxide.

DETAILED DESCRIPTION OF THE INVENTION

Embodiments of a method for fabricating a silicon-on-insulator (SOI) wafer having an etch stop layer overlying the insulating layer are disclosed. Also disclosed are embodiments of an SOI wafer having an etch stop layer overlying the insulating layer, wherein the insulating layer may comprise silicon dioxide ($SiO_2$). In one embodiment, the etch stop layer comprises silicon nitride ($Si_3N_4$). In another embodiment, the etch stop layer comprises nitrogen-doped silicon dioxide. In a further embodiment, the etch stop layer comprises silicon oxynitride ($Si_{(X)}O_{(Y)}N_{(Z)}$). In yet a further embodiment, the etch stop layer comprises a combination of two or more of silicon nitride, nitrogen-doped silicon dioxide, and silicon oxynitride. In another embodiment, the concentration of nitrogen varies through the thickness of the etch stop layer (and, perhaps, within other layers of the SOI wafer). The disclosed SOI wafer may provide both the electrical isolation characteristics of an oxide insulating layer and the etch stop capabilities of the etch stop layer.

Figure 1A:
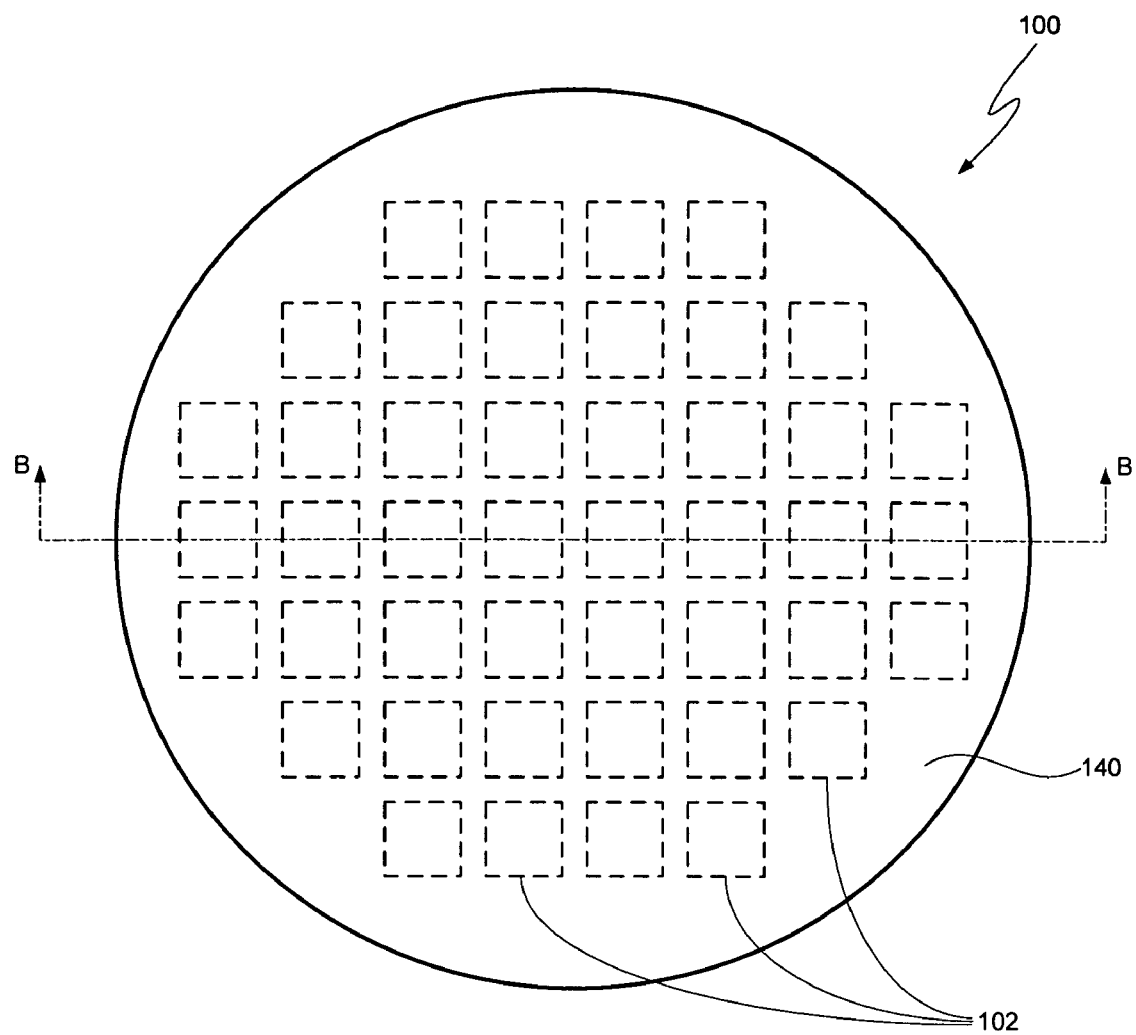
FIG. 1A is a plan view of one embodiment of an SOI wafer having an etch stop layer overlying a buried oxide layer.
Figure 1B:
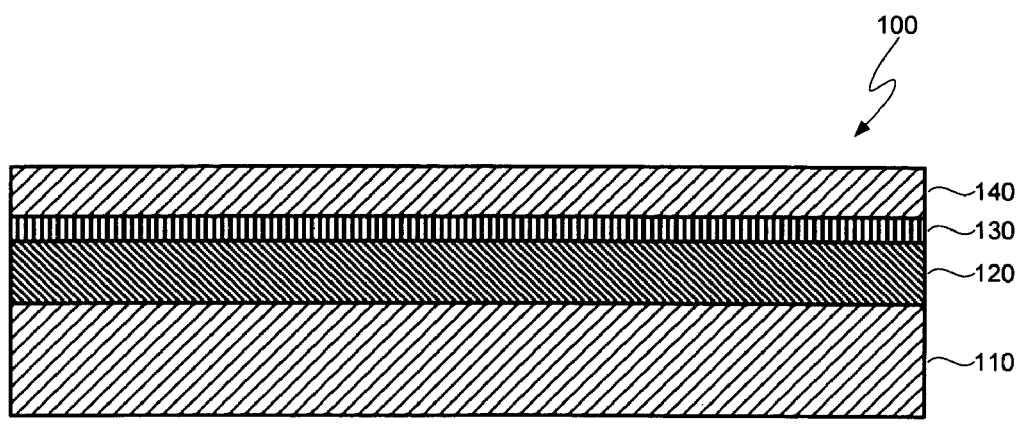
FIG. 1B is a cross-sectional elevation view of the SOI wafer of FIG. 1A, as taken along line B-B of FIG. 1A.

Illustrated in FIGS. 1A and 1B is an embodiment of an SOI wafer 100 having an etch stop layer overlying an insulating layer. Referring to these figures, the SOI wafer 100 comprises a base layer of a semiconductor material 110, a layer of an insulating material 120 overlying the base layer 110, an etch stop layer 130 overlying the insulating layer 120, and an upper layer 140 of the semiconductor material overlying the etch stop layer 130. In one embodiment, the semiconductor material (of base layer 110 and upper layer 140) comprises silicon, and the insulating layer 120 comprises silicon dioxide ($SiO_2$). In one embodiment, the etch stop layer 130 comprises silicon nitride ($Si_3N_4$). However, the etch stop layer 130 may not comprise a distinct stoichiometric silicon nitride material, and in other embodiments the concentration of nitrogen varies through the thickness of the etch stop layer (and the nitrogen concentration may also vary within other layers of the SOI wafer 100). Thus, for example, in another embodiment the etch stop layer comprises nitrogen-doped silicon dioxide, and in a further embodiment the etch stop layer comprises silicon oxynitride ($Si_{(X)}O_{(Y)}N_{(Z)}$). In yet a further embodiment, the etch stop layer comprises a combination of two or more of silicon nitride, nitrogen-doped silicon dioxide, and silicon oxynitride.

In one embodiment, the insulating layer 120 has a thickness of between approximately 300-2500 Angstroms, the etch stop layer 130 has a thickness of between approximately 3-200 Angstroms, and the upper semiconductor layer 140 has a thickness of between approximately 30-2000 Angstroms. The overall thickness of the SOI wafer 100 is, in one embodiment, approximately 775 μm for a 300 mm wafer. In a further embodiment, the etch stop layer 130 overlies substantially all (or a substantial portion) of the insulating layer 120, and in a further embodiment the upper semiconductor layer 140 overlies substantially all (or a substantial portion) of the etch stop layer 130.

In other embodiments, the base semiconductor layer 110, insulating layer 120, etch stop layer 130, and upper semiconductor layer 140 comprise materials other than those described above. For example, in other embodiments, an etch stop layer may be formed by doping or implantation of a substance other than nitrogen. Thus, it should be understood that the disclosed embodiments are not limited to an etch stop layer including nitrogen and, further, that other etch stop materials are within the scope of the disclosed embodiments. Furthermore, it should be understood that the disclosed etch stop layer may perform other functions in addition to (or in lieu of) that of an etch stop. For example, the disclosed nitrogen-containing layer overlying the buried oxide layer may also function as a diffusion barrier (e.g., as a dopant diffusion barrier to facilitate doping of the upper semiconductor layer 140).

In another embodiment, as shown in FIG. 1A, integrated circuitry for a number of die 102 may be formed on the SOI wafer 100. The integrated circuitry of each die 102 may be formed in the upper semiconductor layer 140, and the underlying layer 130 may function as an etch stop during the formation of this circuitry (e.g., as an etch stop during the formation of isolation trenches, etc.). Although not shown in the figures for ease of illustration, a number of layers of metallization (each layer of metallization separated from adjacent layers by a dielectric layer) may be formed over the wafer 100 to create an interconnect structure for each die 102. Ultimately, each of the die 102 may be singulated from the wafer 100, and each die 102 may be packaged in some manner for integration into a next-level assembly (e.g., a circuit board, a computer system, a wireless communication device, etc.).

Figure 2:
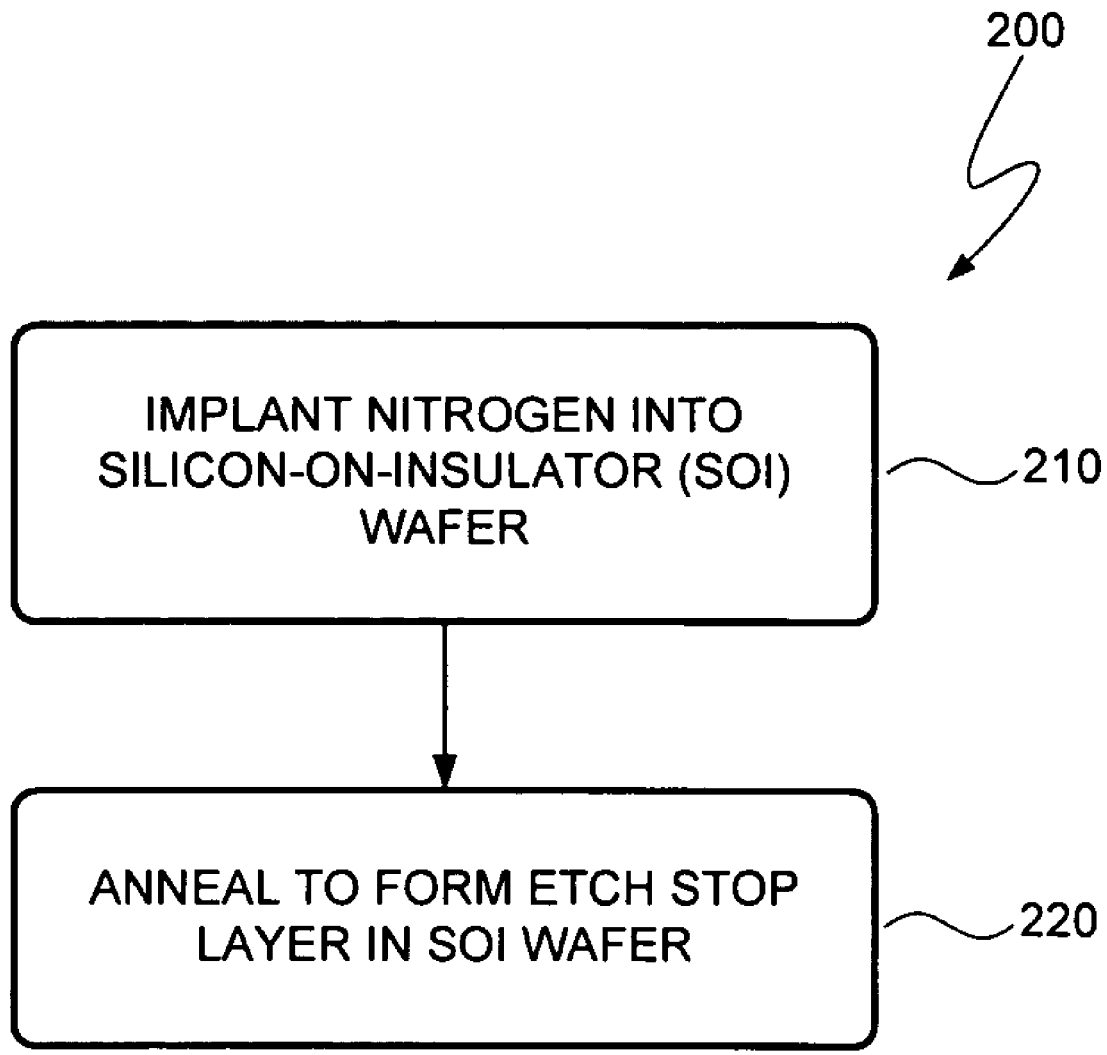
FIG. 2 is a block diagram illustrating an embodiment of a method of creating an etch stop layer in a SOI wafer.

The disclosed embodiments encompass various methods of forming an etch stop layer that overlies the buried oxide layer (or other insulating layer) of a SOI wafer. Illustrated in FIG. 2 is one embodiment of a method 200 of forming an etch stop layer in a SOI wafer. Embodiments of the method 200 shown in FIG. 2 are further illustrated in the schematic diagrams of FIGS. 3A through 3C, as well as FIG. 4, and reference should be made to these figures as called out in the text.

Figure 3A:
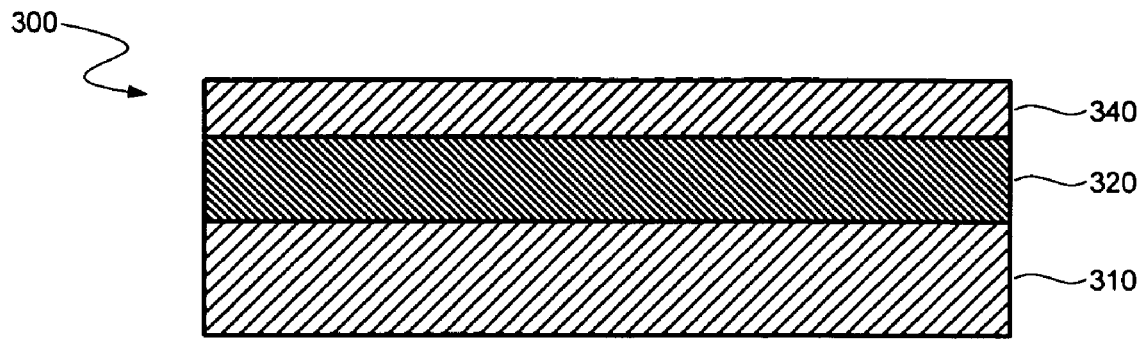
FIGS. 3A-3C are schematic diagrams illustrating embodiments of the method shown in FIG. 2.

Referring first to FIG. 3A, an embodiment of a SOI wafer 300 is shown. This wafer 300 includes a base layer of silicon 310, a layer of silicon dioxide 320 overlying the base layer 310, and an upper layer of silicon 340. The SOI wafer 300 of FIG. 3A may be formed by any suitable process, such as, for example, wafer bonding or SIMOX.

Figure 3B:
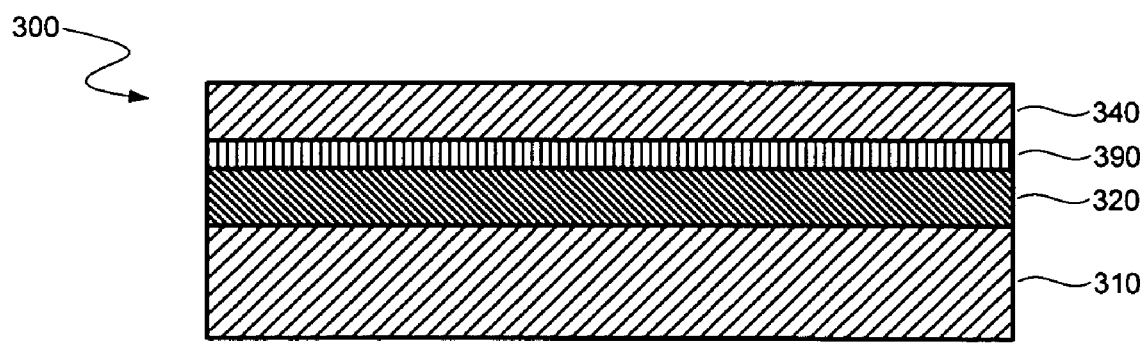

As set forth in block 210 of FIG. 2, nitrogen is implanted into a SOI wafer. This is illustrated in FIG. 3B, where nitrogen has been implanted into a region 390 of the SOI wafer 300 of FIG. 3A. It should be understood that region 390 is representative of a region that can be targeted for implantation of nitrogen and that, in practice, nitrogen may be implanted into additional portions of the wafer 300. For example, as will be described below, the nitrogen concentration may vary from a small amount near the surface of the upper silicon layer 340 to a maximum concentration lower in the wafer, and again vary to a small amount even deeper into the wafer. The maximum concentration may, for example, occur at the interface between the upper silicon layer 340 and the silicon dioxide layer 320, or the maximum nitrogen concentration may occur at some point within the silicon dioxide layer 320.

Nitrogen can be implanted under any suitable conditions using any suitable implantation equipment. In one embodiment, nitrogen implantation is performed at an elevated temperature to increase the nitrogen concentration while decreasing the potential for damage in the upper silicon layer 340. For example, according to one embodiment, nitrogen implantation is performed at a temperature in a range up to 450 degrees Celsius.

The implanted nitrogen will be used to form an etch stop layer, as will be described below. According to some embodiments, this etch stop layer may comprise silicon nitride, nitrogen-doped silicon dioxide, or silicon oxynitride (or a combination of these materials). Two factors which may impact the characteristics of this etch stop layer include the maximum nitrogen concentration and the region or depth that is targeted to receive the maximum nitrogen dose. This is further illustrated in FIG. 4, which shows nitrogen concentration as a function of wafer depth. According to one embodiment, the maximum concentration of nitrogen is implanted at the interface between the buried oxide layer and the upper silicon layer. This is illustrated by curve 490a, which has a maximum nitrogen concentration at the interface between a buried oxide layer 420 and an upper silicon layer 440. In another embodiment, the maximum concentration of the nitrogen is implanted within the buried oxide layer. This is illustrated by curve 490b, which has a maximum nitrogen concentration at some location within the silicon dioxide layer 420. In one embodiment, the maximum concentration of nitrogen may be within a range up to $10^{20}$ atoms/cm$^3$.

Targeting the maximum nitrogen concentration at the interface between the buried oxide layer and the upper silicon layer may provide the greatest thickness of silicon nitride above the buried oxide layer, whereas targeting the maximum nitrogen concentration at a region within the buried oxide layer may reduce the concentration of nitrogen in the upper silicon layer. The maximum nitrogen concentration and the region targeted to receive the maximum concentration will be a function of the desired characteristics of the SOI wafer, and these variables—as well as others, such as the implantation conditions—can be tailored as appropriate on a case-by-case basis.

Figure 4:
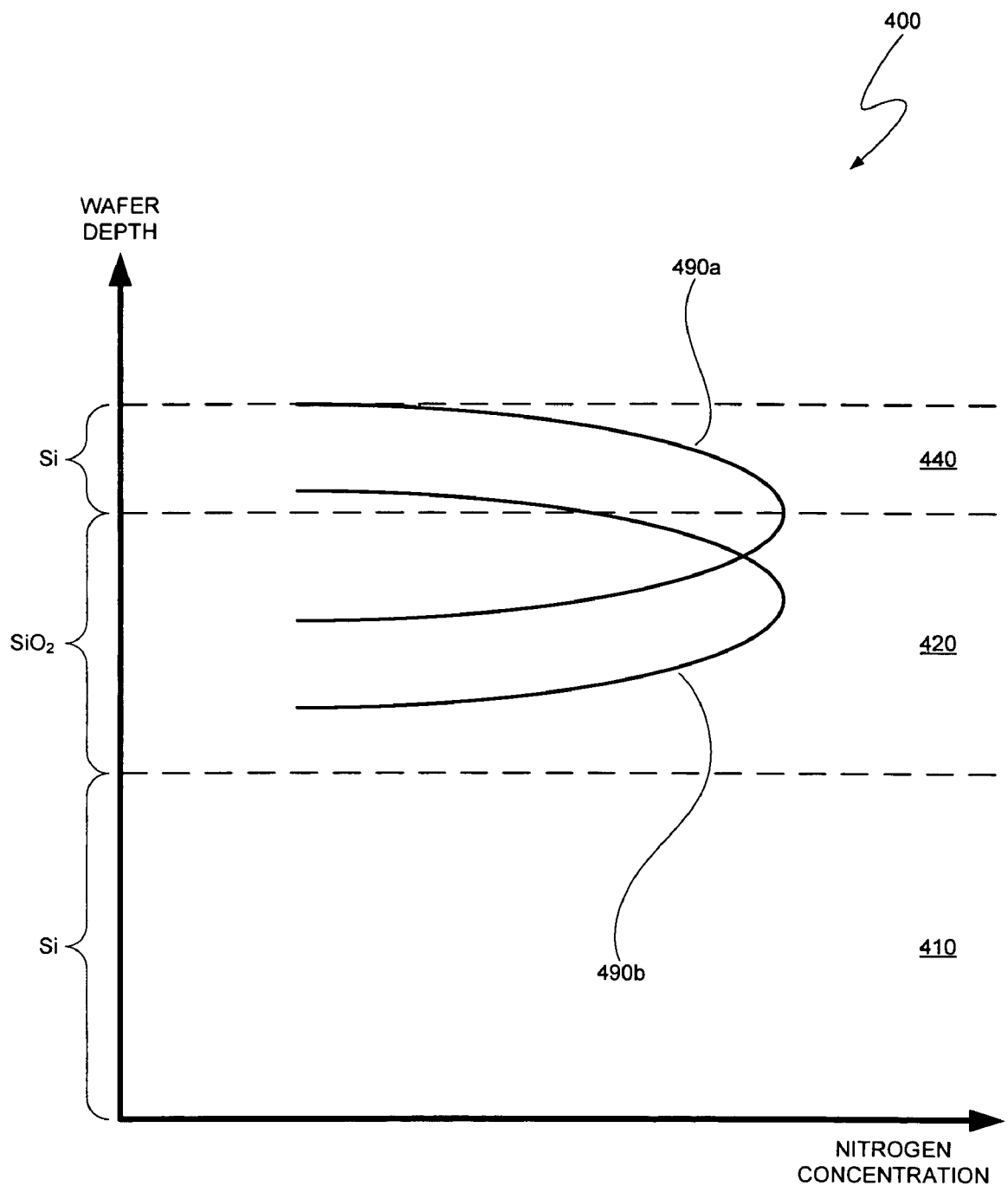
FIG. 4 is a schematic diagram showing nitrogen concentration vs. wafer depth for various embodiments of the method illustrated in FIG. 2.

It should be noted that, in FIG. 4, the curves 490a, 490b representing the nitrogen concentration as a function of depth have been idealized for ease of illustration and understanding. For example, the curves 490a, 490b are shown as being generally smooth and continuous; however, in practice, there may be discontinuities in nitrogen concentration at the boundaries between material layers.

Figure 3C:
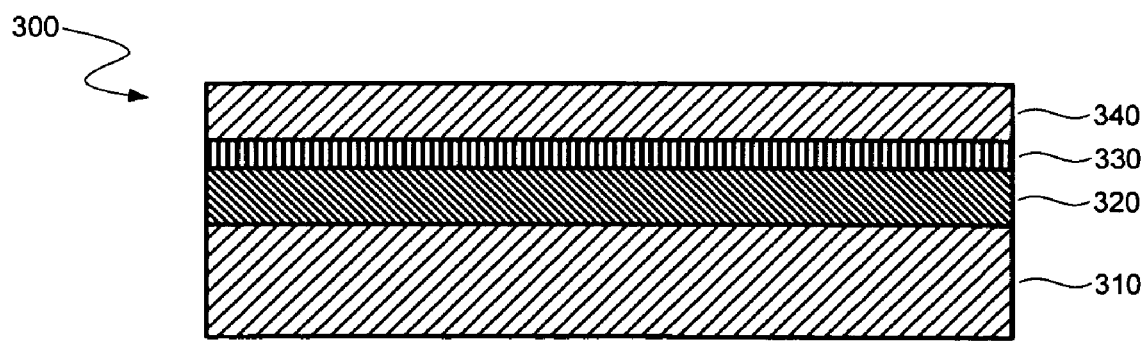

Referring next to block 220 in FIG. 2, an annealing process is performed to form an etch stop layer. This is illustrated in FIG. 3C, where an etch stop layer 330 has been formed in the SOI wafer 300, this etch stop layer disposed above the buried oxide layer 320 and below the upper silicon layer 340. According to one embodiment, while at elevated temperature during anneal, silicon nitride precipitates begin to form, and these precipitates will gather nitrogen from the surrounding silicon. Thus, as heating continues, diffusion and/or redistribution of nitrogen may occur and a silicon nitride layer may form at the interface between the upper silicon layer 340 and the buried oxide layer 320.

As previously noted, however, the etch stop layer may not comprise a distinct stoichiometric silicon nitride layer, and the formation of silicon nitride precipitates may not occur. Further, in other embodiments, the nitrogen concentration of the formed etch stop layer may vary continuously through the interface region between the upper silicon layer and the buried oxide layer. For example, the maximum concentration of nitrogen in the etch stop layer may occur at the interface region between the upper silicon layer and the buried oxide layer, with the nitrogen concentration decaying away into the buried oxide layer (as well as decaying into the upper silicon layer). Accordingly, in one embodiment, the etch stop layer 330 may comprise nitrogen-doped silicon dioxide, and in a further embodiment the etch stop layer may comprise silicon oxynitride. In another embodiment, the etch stop layer 330 may comprise a combination of two or more of silicon nitride, nitrogen-doped silicon dioxide, and silicon oxynitride.

Annealing to form the etch stop layer (from the implanted nitrogen) may be performed under any suitable conditions which can lead to the formation of silicon nitride, nitrogen-doped silicon dioxide, or silicon oxynitride (or some combination of these materials). In one embodiment, anneal is performed at a temperature of approximately 1200 degrees Celsius for approximately 2 hours. According to another embodiment, the SOI wafer is placed in a process chamber in which nitrogen can be introduced, and annealing is performed in a flowing nitrogen environment.

Figure 5:
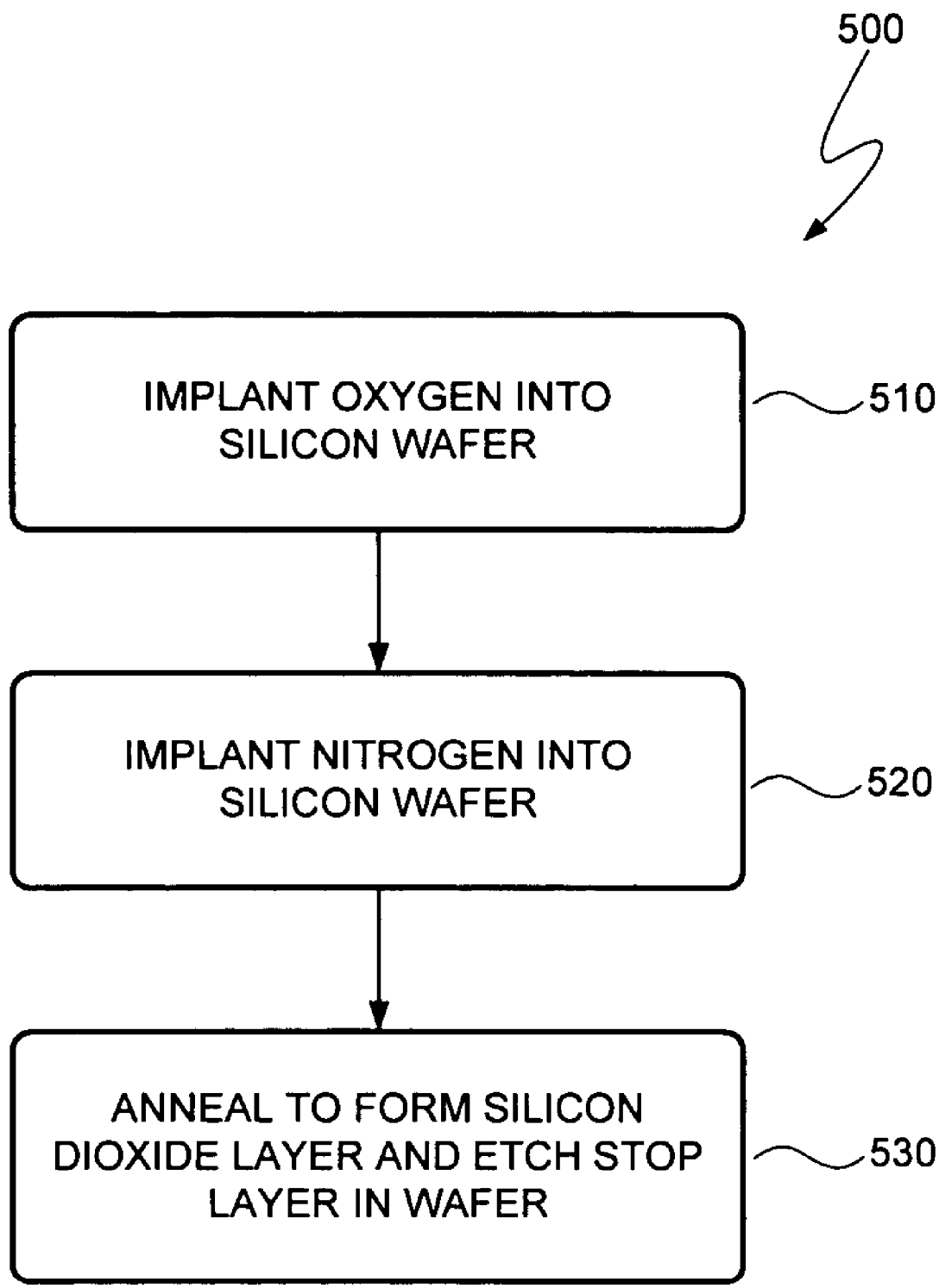
FIG. 5 is a block diagram illustrating an embodiment of a method of creating an SOI wafer having an etch stop layer overlying the buried oxide.

Illustrated in FIG. 5 is another embodiment of a method 500 of forming a SOI wafer including an etch stop layer. Embodiments of the method 500 shown in FIG. 5 are further illustrated in the schematic diagrams of FIGS. 6A through 6D, as well as FIG. 7, and reference should be made to these figures as called out in the text.

Figure 6A:
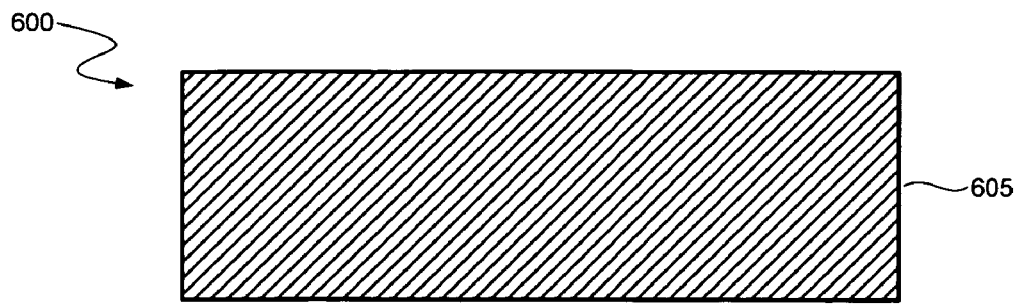
FIGS. 6A-6D are schematic diagrams illustrating embodiments of the method shown in FIG. 5.

Referring first to FIG. 6A, an embodiment of a wafer 600 is shown. In one embodiment, the wafer 600 includes a substrate 605 comprised of silicon.

Figure 6B:
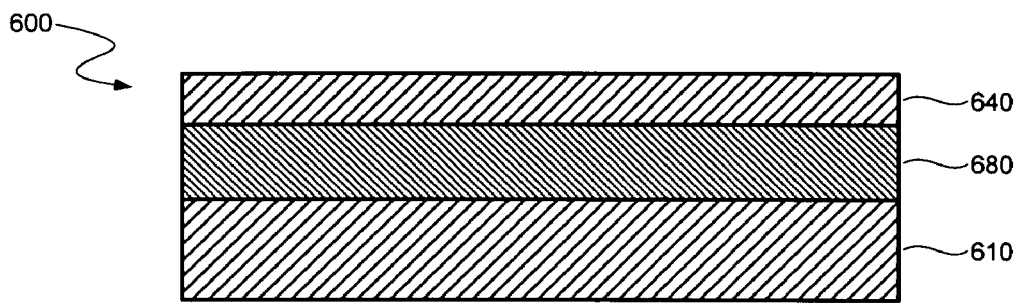

As set forth in block 510 of FIG. 5, oxygen is implanted into a silicon wafer. This is illustrated in FIG. 6B, where oxygen has been implanted into a region 680 of the wafer 600 of FIG. 6A. The implanted oxygen will be used to form a buried oxide layer. It should be understood that the region 680 is representative of a region that can be targeted for implantation of oxygen and that, in practice, oxygen may be implanted into additional portions of the wafer 600. By way of example, the oxygen concentration may vary from a small amount near the upper surface of the wafer 600 to a maximum concentration lower in the wafer, and again vary to a small amount even deeper into the wafer.

Figure 7:
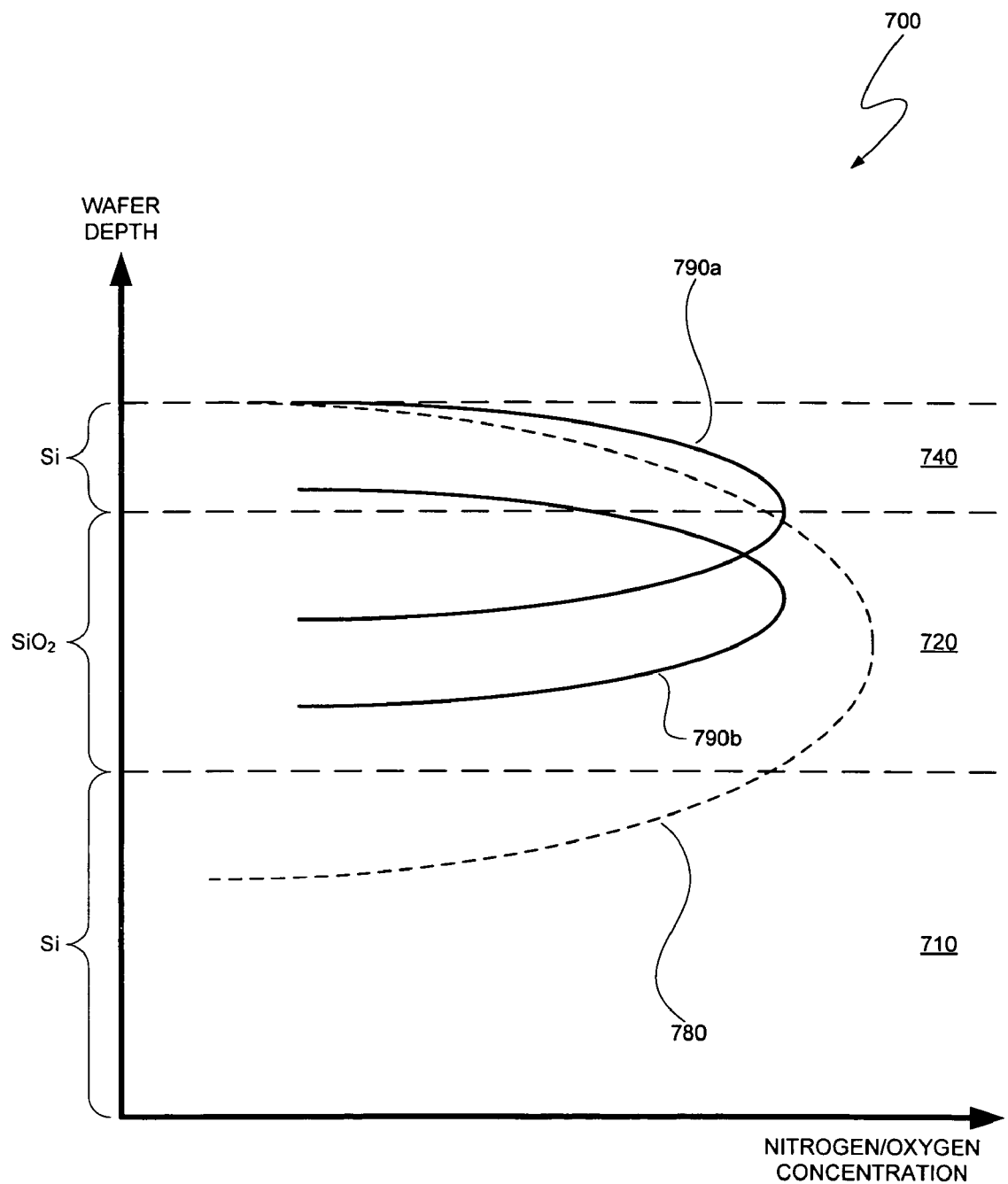
FIG. 7 is a schematic diagram showing both nitrogen concentration and oxygen concentration vs. wafer depth for various embodiments of the method illustrated in FIG. 5.

Oxygen can be implanted under any suitable conditions using any suitable implantation equipment. According to one embodiment, oxygen is implanted at an elevated temperature to increase the oxygen concentration while decreasing the potential for damage in the silicon substrate 605. By way of example, in one embodiment, oxygen implantation is performed at a temperature in a range up to 450 degrees Celsius. The maximum oxygen concentration is targeted at that region or depth of the wafer where the buried oxide layer is to be formed. This is illustrated in FIG. 7, which shows the oxygen concentration as a function of wafer depth (nitrogen concentration is also shown in this figure and will be described below). The curve 780 (dashed line) represents the oxygen concentration, and this curve suggests that the maximum oxygen concentration falls within that region of the wafer where a buried oxide layer (see item 720) is to be formed. In one embodiment, the maximum oxygen concentration may be within a range up to $10^{22}$ atoms/cm$^3$.

Figure 6C:
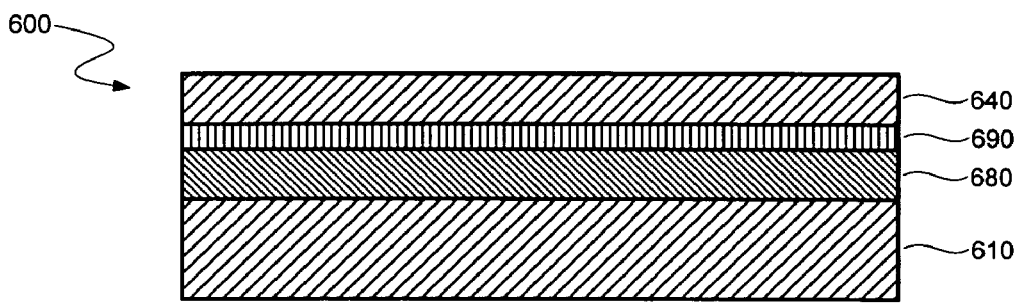

Referring to block 520 in FIG. 5, nitrogen is implanted into the wafer. This is illustrated in FIG. 6C, where nitrogen has been implanted into a region 690 of the silicon wafer 600. It should be understood that region 690 is representative of a region that can be targeted for implantation of nitrogen and that, in practice, nitrogen may be implanted into additional portions of the wafer 600. For example, as will be described below, the nitrogen concentration may vary from a small amount near the upper surface of the wafer 600 to a maximum concentration lower in the wafer, and again vary to a small amount even deeper into the wafer. The maximum concentration may, for example, occur at that region that is to become the interface between an upper silicon layer and a buried oxide layer, or the maximum nitrogen concentration may occur at some point within that region that is to become the buried oxide layer.

As before, nitrogen can be implanted under any suitable conditions using any suitable implantation equipment. In one embodiment, nitrogen implantation is performed at an elevated temperature to increase the nitrogen concentration while decreasing the potential for damage to the wafer 600 (e.g., that portion of wafer 600 that is to become an upper silicon layer 640). For example, according to one embodiment, nitrogen implantation is performed at a temperature in a range up to 450 degrees Celsius.

The implanted nitrogen will be used to form an etch stop layer that overlies the buried oxide layer (that is to be formed from the implanted oxygen). In some embodiments, this etch stop layer may comprise silicon nitride, nitrogen-doped silicon dioxide, or silicon oxynitride (or a combination of these materials). As noted above, two factors which may impact the characteristics of the silicon nitride layer include the maximum nitrogen concentration and the region or depth that is targeted to receive the maximum nitrogen dose. This is illustrated in FIG. 7, which shows nitrogen concentration (and oxygen concentration) as a function of wafer depth. According to one embodiment, the maximum concentration of nitrogen is implanted at that region that is to become the interface between a buried oxide layer and an upper silicon layer. This is illustrated by curve 790a, which has a maximum nitrogen concentration at that plane that is to become the interface between a silicon dioxide layer 720 and an upper silicon layer 740. In another embodiment, the maximum concentration of nitrogen is implanted within a region that is to become a buried oxide layer. This is illustrated by curve 790b, which has a maximum nitrogen concentration at some location within the region that is to become the buried oxide layer 720. In one embodiment, the maximum concentration of nitrogen may be within a range up to $10^{20}$ atoms/cm$^3$.

Targeting the maximum nitrogen concentration to be at the interface between the buried oxide layer and the upper silicon layer may provide the greatest thickness of silicon nitride above the buried oxide layer, whereas targeting the maximum nitrogen concentration to be at a region within the buried oxide layer may reduce the concentration of nitrogen in the upper silicon layer. As previously suggested, the maximum nitrogen concentration (and maximum oxygen concentration) and the region targeted to receive the maximum concentration will be a function of the desired characteristics of the SOI wafer, and these variables—as well as others, such as the implantation conditions—can be tailored as appropriate on a case-by-case basis.

It should be noted that, in FIG. 7, the curves 790a, 790b representing the nitrogen concentration as a function of depth (as well as curve 780 representing the oxygen concentration) have been idealized for ease of illustration and understanding. For example, the curves 790a, 790b (and 780) are shown as being generally smooth and continuous; however, in practice, there may be discontinuities in nitrogen concentration at the boundaries between material layers.

Figure 6D:
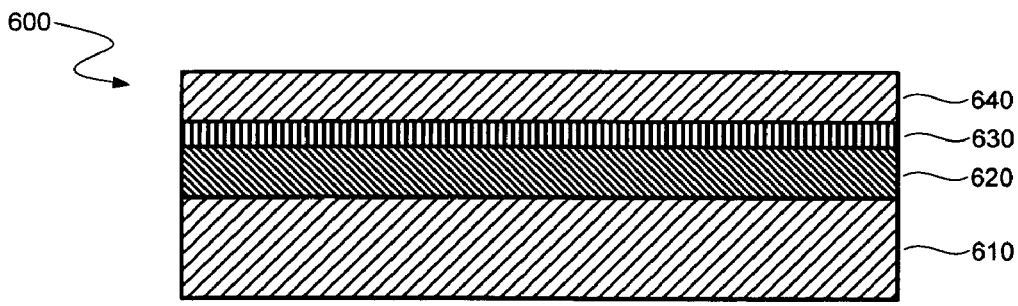

As set forth in block 530 in FIG. 5, an annealing process is performed to form a silicon dioxide layer as well as an etch stop layer. This is illustrated in FIG. 6D, where a silicon dioxide layer 620 and an etch stop layer 630 have each been formed to create a SOI wafer 600. The silicon dioxide layer 620 is formed in that region of the silicon wafer that was targeted for oxygen implantation, and the etch stop layer 630 is formed in the interface region between the silicon dioxide layer 620 and an upper silicon layer 640. Thus, the etch stop layer is disposed above the buried oxide layer 620 and below the upper silicon layer 640. According to one embodiment, during anneal at elevated temperature, silicon nitride precipitates begin to form, and these precipitates will gather nitrogen from the surrounding silicon. Thus, as heating continues, diffusion and/or redistribution of nitrogen will occur and a silicon nitride layer may form at the interface between the upper silicon layer 640 and the buried oxide layer 620 that is forming. Similar mechanisms may lead to the formation of the silicon dioxide layer.

As previously noted, however, the etch stop layer may not comprise a distinct stoichiometric silicon nitride layer, and the formation of silicon nitride precipitates may not occur. Further, in other embodiments, the nitrogen concentration of the formed etch stop layer may vary continuously through the interface region between the upper silicon layer and the buried oxide layer that is forming. For example, the maximum concentration of nitrogen in the etch stop layer may occur at the interface region between the upper silicon layer and the buried oxide layer, with the nitrogen concentration decaying away into the buried oxide layer (as well as decaying into the upper silicon layer). Accordingly, in one embodiment, the etch stop layer 330 may comprise nitrogen-doped silicon dioxide, and in a further embodiment the etch stop layer may comprise silicon oxynitride. In another embodiment, the etch stop layer 330 may comprise a combination of two or more of silicon nitride, nitrogen-doped silicon dioxide, and silicon oxynitride.

Annealing to form the silicon dioxide layer (from the implanted oxygen) and the etch stop layer (from the implanted nitrogen) may be performed under any suitable conditions which can lead to the formation of silicon dioxide and silicon nitride, nitrogen-doped silicon dioxide, or silicon oxynitride (or some combination of these materials). In one embodiment, anneal is performed at a temperature of approximately 1350 degrees Celsius for between approximately 5 to 12 hours. According to another embodiment, the wafer is placed in a process chamber in which nitrogen and/or oxygen can be introduced, and annealing is performed in a flowing nitrogen and/or oxygen environment.

Figure 8:
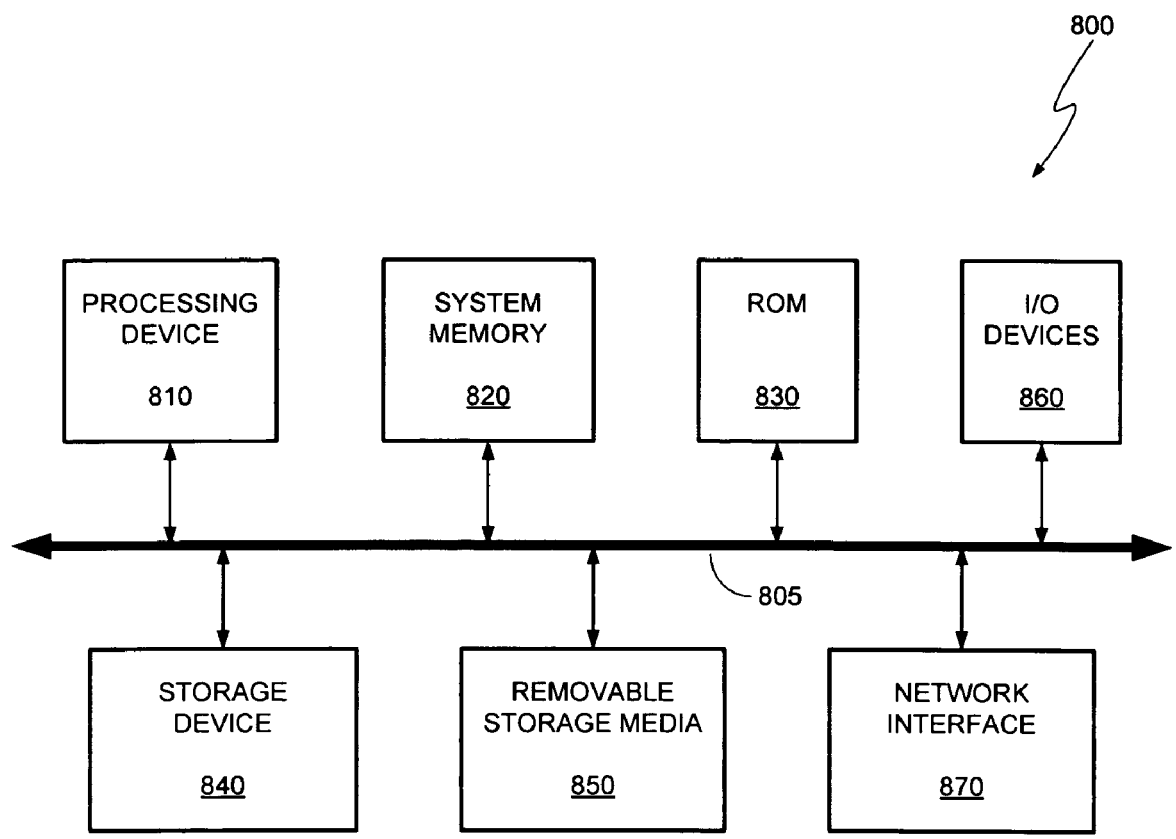
FIG. 8 is a schematic diagram illustrating an embodiment of a computer system, which may include a semiconductor die formed according to the disclosed embodiments.

Referring to FIG. 8, illustrated is an embodiment of a computer system 800. Computer system 800 includes a bus 805 to which various components are coupled. Bus 805 is intended to represent a collection of one or more buses—e.g., a system bus, a Peripheral Component Interface (PCI) bus, a Small Computer System Interface (SCSI) bus, etc.—that interconnect the components of system 800. Representation of these buses as a single bus 805 is provided for ease of understanding, and it should be understood that the system 800 is not so limited. Those of ordinary skill in the art will appreciate that the computer system 800 may have any suitable bus architecture and may include any number and combination of buses.

Coupled with bus 805 is a processing device (or devices) 810. The processing device 810 may comprise any suitable processing device or system, including a microprocessor, a network processor, an application specific integrated circuit (ASIC), or a field programmable gate array (FPGA), or similar device. It should be understood that, although FIG. 8 shows a single processing device 810, the computer system 800 may include two or more processing devices.

Computer system 800 also includes system memory 820 coupled with bus 805, the system memory 820 comprising, for example, any suitable type and number of memories, such as static random access memory (SRAM), dynamic random access memory (DRAM), synchronous DRAM (SDRAM), or double data rate DRAM (DDRDRAM). During operation of computer system 800, an operating system and other applications may be resident in the system memory 820.

The computer system 800 may further include a read-only memory (ROM) 830 coupled with the bus 805. During operation, the ROM 830 may store temporary instructions and variables for processing device 810. The system 800 may also include a storage device (or devices) 840 coupled with the bus 805. The storage device 840 comprises any suitable non-volatile memory, such as, for example, a hard disk drive. The operating system and other programs may be stored in the storage device 840. Further, a device 850 for accessing removable storage media (e.g., a floppy disk drive or a CD ROM drive) may be coupled with bus 805.

The computer system 800 may also include one or more I/O (Input/Output) devices 860 coupled with the bus 805. Common input devices include keyboards, pointing devices such as a mouse, as well as other data entry devices, whereas common output devices include video displays, printing devices, and audio output devices. It will be appreciated that these are but a few examples of the types of I/O devices that may be coupled with the computer system 800.

The computer system 800 may further comprise a network interface 870 coupled with bus 805. The network interface 870 comprises any suitable hardware, software, or combination of hardware and software that is capable of coupling the system 800 with a network (e.g., a network interface card). The network interface 870 may establish a link with the network (or networks) over any suitable medium—e.g., wireless, copper wire, fiber optic, or a combination thereof—supporting the exchange of information via any suitable protocol—e.g., TCP/IP (Transmission Control Protocol/Internet Protocol), HTTP (Hyper-Text Transmission Protocol), as well as others.

It should be understood that the computer system 800 illustrated in FIG. 8 is intended to represent an exemplary embodiment of such a system and, further, that this system may include many additional components, which have been omitted for clarity and ease of understanding. By way of example, the system 800 may include a DMA (direct memory access) controller, a chip set associated with the processing device 810, additional memory (e.g., a cache memory), as well as additional signal lines and buses. Also, it should be understood that the computer system 800 may not include all of the components shown in FIG. 8.

In one embodiment, the computer system 800 includes a component having an integrated circuit die that was formed on an SOI wafer having an etch stop layer, such as a silicon nitride layer, as described above. For example, the processing device 810 of system 800 may include such an integrated circuit die. However, it should be understood that other components of system 800 (e.g., network interface 870, etc.) may include a device having an integrated circuit die formed on an SOI wafer including a silicon nitride etch stop (or other etch stop layer).

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. A method comprising forming an etch stop layer in a silicon-on-insulator (SOI) wafer, the etch stop layer overlying an insulating layer of the SOI wafer, wherein the etch stop layer comprises at least two different materials including silicon nitride and at least one of nitrogen-doped silicon dioxide or silicon oxynitride, wherein forming the etch stop layer comprises implanting nitrogen into the SOI wafer with a maximum concentration of the implanted nitrogen at an interface between an upper silicon layer and the insulating layer of the SOI wafer and annealing the SOI wafer to form the etch stop layer, wherein forming the etch stop layer comprises implanting nitrogen into the SOI wafer and annealing the SOI wafer to form the etch stop layer.

2. The method of claim 1, wherein a concentration of nitrogen varies through the etch stop layer.

3. The method of claim 1, wherein the SOI wafer comprises a number of bonded layers.

4. The method of claim 1, wherein the insulating layer of the SOI wafer comprises an oxide layer formed by a process including oxygen implantation.

5. A method comprising:
implanting nitrogen into a wafer, the wafer including a base silicon layer, a silicon dioxide layer overlying the base silicon layer, and an upper silicon layer overlying the silicon dioxide layer, wherein a maximum concentration of the implanted nitrogen is located at an interface between the upper silicon layer and the silicon dioxide layer; and
annealing the wafer to form a layer between the upper silicon layer and the silicon dioxide layer, the layer between the upper silicon layer and the silicon dioxide layer including at least two different materials comprising silicon nitride and at least one of nitrogen-doped silicon dioxide or silicon oxynitride.

6. The method of claim 5, further comprising forming integrated circuitry for a number of die in the upper silicon layer.

7. The method of claim 6, wherein the layer formed between the silicon dioxide layer and the upper silicon layer functions as an etch stop.

* * * * *